(12) United States Patent
Huang

(10) Patent No.: US 7,443,684 B2
(45) Date of Patent: Oct. 28, 2008

(54) HEAT SINK APPARATUS

(75) Inventor: Fu-Kuo Huang, Tucheng (TW)

(73) Assignee: Nanoforce Technologies Corporation, Taipei County (TW)

( * ) Notice: Subject to any disclaimer, the term of this patent is extended or adjusted under 35 U.S.C. 154(b) by 0 days.

(21) Appl. No.: 11/402,965

(22) Filed: Apr. 13, 2006

(65) Prior Publication Data
US 2007/0115641 A1    May 24, 2007

(30) Foreign Application Priority Data
Nov. 18, 2005    (CN) .............................. 94220042 U

(51) Int. Cl.
*H05K 7/20*    (2006.01)
*H01L 23/36*    (2006.01)
(52) U.S. Cl. ................. 361/710; 361/704; 361/709; 165/80.3
(58) Field of Classification Search ......... 361/690–697, 361/702–707, 709–712; 165/80.2, 80.3, 165/80.4, 185, 104.21, 104.33; 257/706–727; 174/16.3
See application file for complete search history.

(56) References Cited

U.S. PATENT DOCUMENTS

| | | | | |
|---|---|---|---|---|
| 4,843,693 A | * | 7/1989 | Chisholm | 29/890.054 |
| 5,180,001 A | * | 1/1993 | Okada et al. | 165/80.4 |
| 5,358,032 A | * | 10/1994 | Arai et al. | 165/80.3 |
| 5,728,622 A | * | 3/1998 | Yu | 438/443 |
| 5,960,863 A | * | 10/1999 | Hua | 165/80.3 |
| 6,561,267 B2 | * | 5/2003 | Sauciuc et al. | 165/185 |

FOREIGN PATENT DOCUMENTS

JP    358125855 A    *    7/1983

* cited by examiner

*Primary Examiner*—Michael V Datskovskiy
(74) *Attorney, Agent, or Firm*—Rosenberg, Klein & Lee

(57) ABSTRACT

The present invention relates to a heat sink apparatus, which discloses that by using a meshed member as a heat sink member, the heat-sinking efficiency will be enhanced owing to increased surface areas. Furthermore, a first linear member is made to contact with a substrate at non-perpendicular angles to increase the stresses thereof, and hence the heat sink member is more resistive to deformation during processing. In addition, the meshed member also provides multiple heat flow paths to enhance heat-sinking efficiency. The heat sink member according to the present invention can also be a 3D fabric, which further improves heat-sinking efficiency from 2D to 3D fabrics. Besides, the heat sink member includes an expanded metal-lath member.

13 Claims, 5 Drawing Sheets

HEAT SINK APPARATUS

FIELD OF THE INVENTION

The present invention relates to a heat sink apparatus, and particularly to an apparatus with an enhanced efficiency of heat sinking for removing heat generated by electronic devices.

BACKGROUND OF THE INVENTION

In modern life, there are various sorts of electronic products, for example, motors and central processing units (CPUs) of computers, which generate heat during operation. With advancement of technologies and influences of world trend, the development direction of electronic products tends to be of high efficiency and to be of lightness, thinness, shortness, and smallness. Accordingly, the corresponding heat generated is getting higher and higher, and is less easy to be removed. If heat sinking is not emphasized, operating efficiencies of electronic products will be affected.

Take computers for example. Heat sink apparatuses, such as heat sink fins, are generally installed on modern CPUs such that heat generated by the CPUs can be conducted to the heat sink fins and thereby be removed. Furthermore, a fan can be installed on the heat sink fins to remove heat absorbed by the heat sink fins rapidly, and consequently to remove heat generated by CPUs indirectly. The processing frequencies of modern CPUs is getting higher and higher. Thereby, the amount of heat generated is getting greater and greater. However, because the area for heat sinking on heat sink fins is limited, the efficiency of heat sinking is limited accordingly. Thus, the CPUs tend to be overheated, and thereby cannot operate normally or will even burn out. In addition, heat sink fins are difficult to manufacture. The fabrication process takes much time, thus the production efficiency is low.

Moreover, because a great amount of heat is easy to be generated during the operation of motors, heat sink fins are installed on modern motors to remove heat generated by the motors. As described above, the heat-removing rate by the heat sink fins is limited. Thereby, for long operation time or under high-speed operations, heat accumulated in the motors will increase to the degree of affecting normal operations, or even to the degree of burning out the motors and resulting in danger.

Accordingly, the present invention provides a heat sink apparatus, which enhance heat-sinking efficiency by increasing areas for heat sinking. Hence, heat generated by electronic devices can be removed rapidly, and the problems described above can be solved.

SUMMARY

The purpose of the present invention is to provide a heat sink apparatus, which increases surface areas of heat sink members to make heat conducted from heat-generating members to the heat sink members be removed rapidly.

The other purpose of the present invention is to provide a heat sink apparatus with superior stresses. When a heat sink member is installed on a substrate, it is necessary to apply pressure thereon. The heat sink members can be made resistive to deformation by increasing stresses thereof in terms of making the contact angles between the heat sink members and the substrate non-perpendicular.

In order to achieve the purposes and effects described above, the present invention discloses a heat sink apparatus, which uses a meshed member fabricated by weaving as a heat sink member. The contact angles between a first linear member included in the meshed member and the substrate are non-perpendicular. Besides, a second linear member intersects with the first linear member. In addition, the heat sink member can be a three-dimensional (3D) fabric fabricated by 3D weaving, or can be an expanded metal-lath member.

In order to make the structure and characteristics as well as the effectiveness of the present invention to be further understood and recognized, the detailed description of the present invention is provided as follows along with preferred embodiments and accompanying figures.

DETAILED DESCRIPTION

The technology of heat sink members in the prior art, for example, cutting or extruding processes, has reached its limit and surface areas of the heat sink members cannot be increased any further to enhance heat-sinking effect thereof. The present invention provides a heat sink apparatus with increased surface areas, and with superior stresses.

Figure 1:
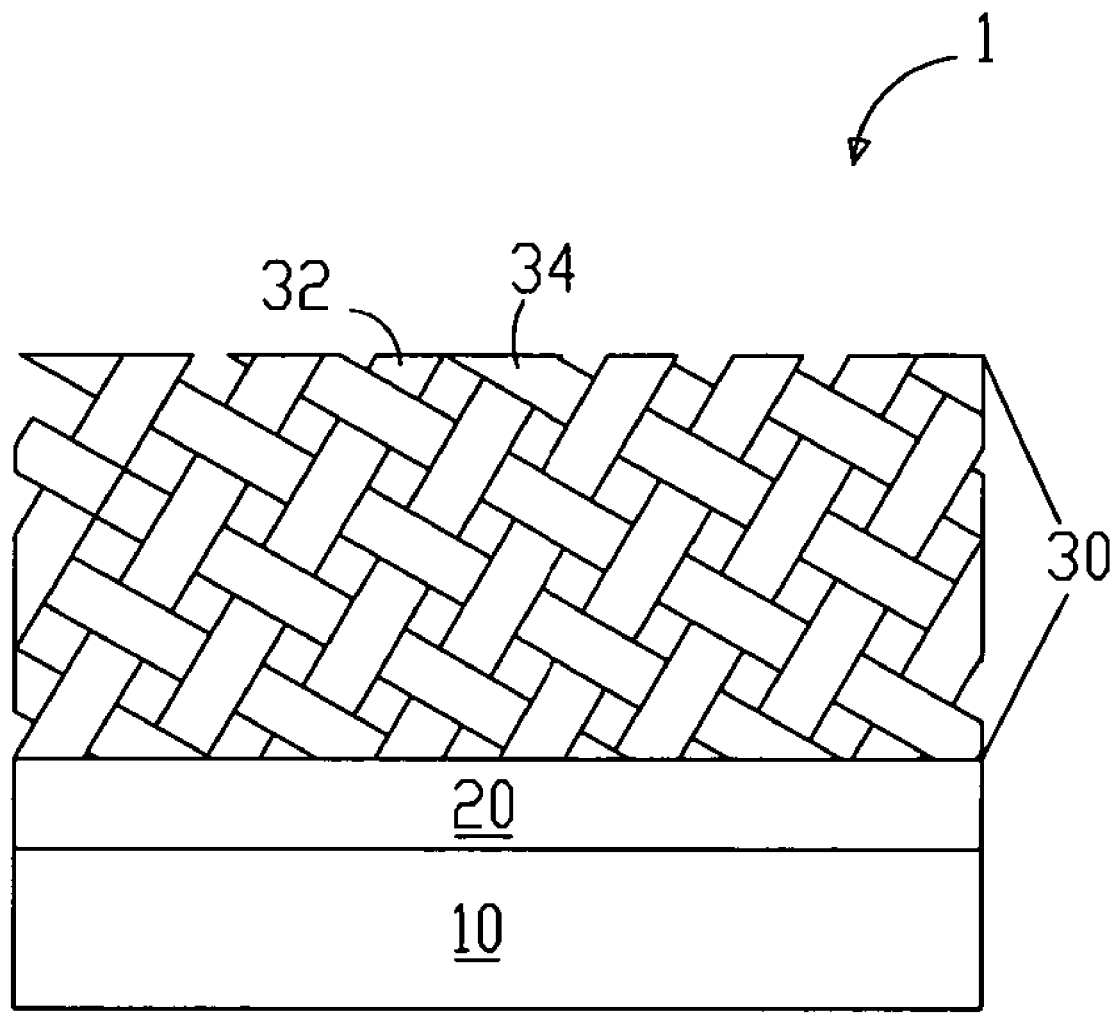
FIG. 1 is a structural schematic diagram according to a preferred embodiment of the present invention.

FIG. 1 is a structural schematic diagram according to a preferred embodiment of the present invention. As shown in the figure, the present invention provides a heat sink apparatus 1, which includes a heat-generating member 10, a substrate 20, and a heat sink member 30. The substrate 20 is installed on the heat-generating member 10, and the heat sink member 30 is installed on the substrate 20, wherein the heat sink member 30 includes a first linear member 32 and a second linear member 34. The material of the substrate 20 includes metals or other materials with high thermal conductivity coefficients to conduct heat generated by the heat-generating member 10 to the substrate 20, and the substrate 20, in turn, will conduct the heat to the heat sink member 30. The heat sink member 30 reduces the heat in the heat-generating member by means of heat exchange with air, wherein the heat sink member 30 is fabricated by weaving. Owing to maturity of weaving technology, in terms of design, metal wires with different diameters or other materials with high thermal conductivity coefficients can be woven into meshed members with various mesh sizes. The surface areas of heat sink apparatuses manufactured by casting, forging, cutting, or extruding processes are much smaller than manufactured according to the structure of the present invention. According to the structure disclosed in the present invention, surface areas for heat sinking can be increased and the heat-sinking efficiency can be enhanced accordingly.

Figure 2A:
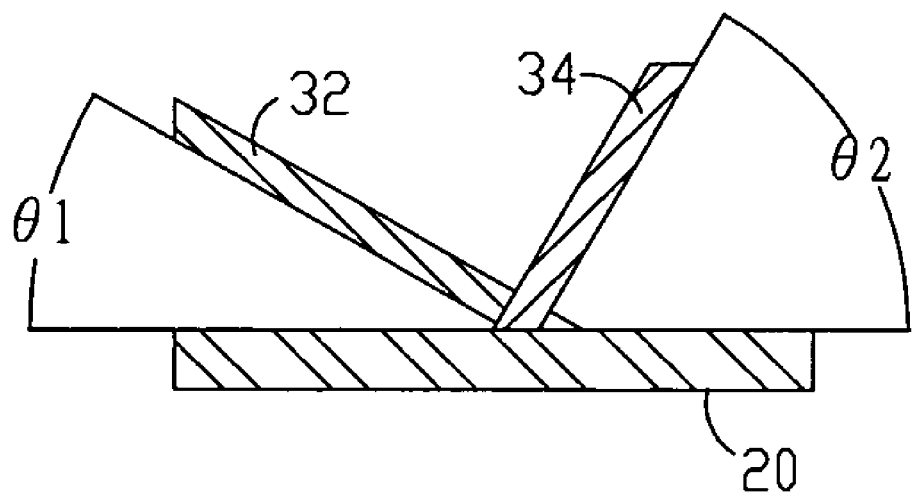
FIG. 2A is a schematic diagram of contact angles between a heat sink member and a substrate according to a preferred embodiment of the present invention.
Figure 2B:
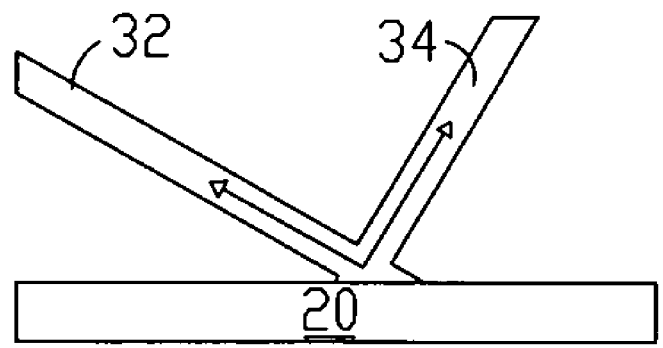
FIG. 2B is a schematic diagram of multiple heat flows at the contact between a heat sink member and a substrate according to a preferred embodiment of the present invention.

Please refer to FIG. 2A and FIG. 2B simultaneously. Because both of the contact angle θ1 between the first linear member 32 of the heat sink member 30 according to the present invention and the substrate 20, and the contact angle θ2 between the second linear member 34 of the heat sink member 30 according to the present invention and the substrate 20 are not right angles, according to the tensor theory of elasticity mechanics, the stress between two objects in contact is an inner product. When the contact angle is greater than 90 degrees, the stress is smaller than 1; on the other hand, when the contact angle is smaller than 90 degrees, the stress is greater than 1. Thereby, the design according to the present invention makes both of the contact angles between the first linear member 32 and the substrate 20 and between the second linear member 34 and the substrate 20 not be right angles, or even be smaller than 90 degrees, to increase their stresses. When the substrate 20 connects with the heat sink member 30, no matter using soldering or welding methods, it is necessary to apply pressure to make the heat sink member 30 contact completely with the substrate 20. If the stresses therein are not sufficient, the heat sink member 30 is prone to deformation. In addition, because the contact angles are not right angles, both of the first linear member 32 and the second linear member 34 will contact the substrate 20 simultaneously, which will result in multiple heat flows. The multiple heat flows conduct heat to the heat sink member 30 by two paths, thereby the heat-sinking efficiency thereof is enhanced.

Figure 3A:
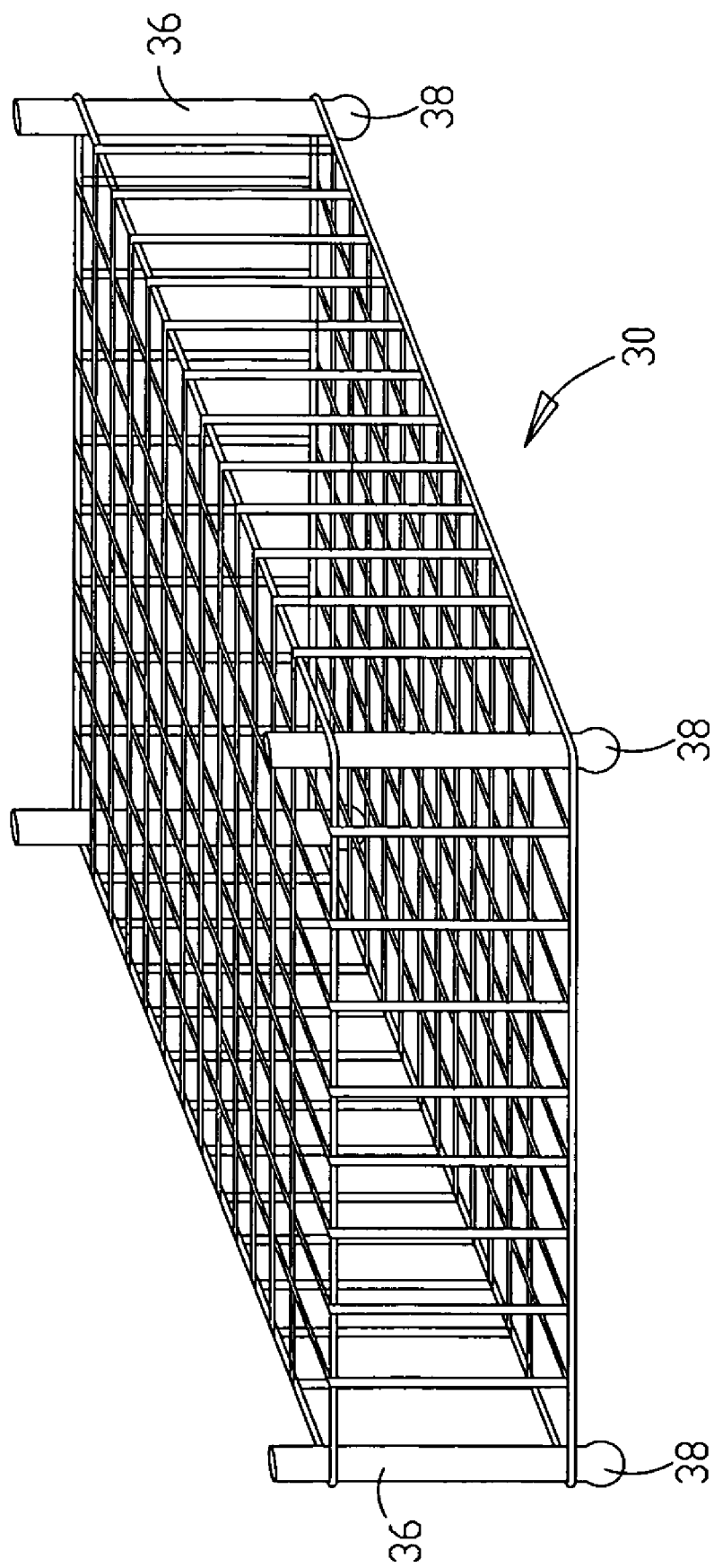
FIG. 3A is a structural schematic diagram of a heat sink member according to another preferred embodiment of the present invention.
Figure 3B:
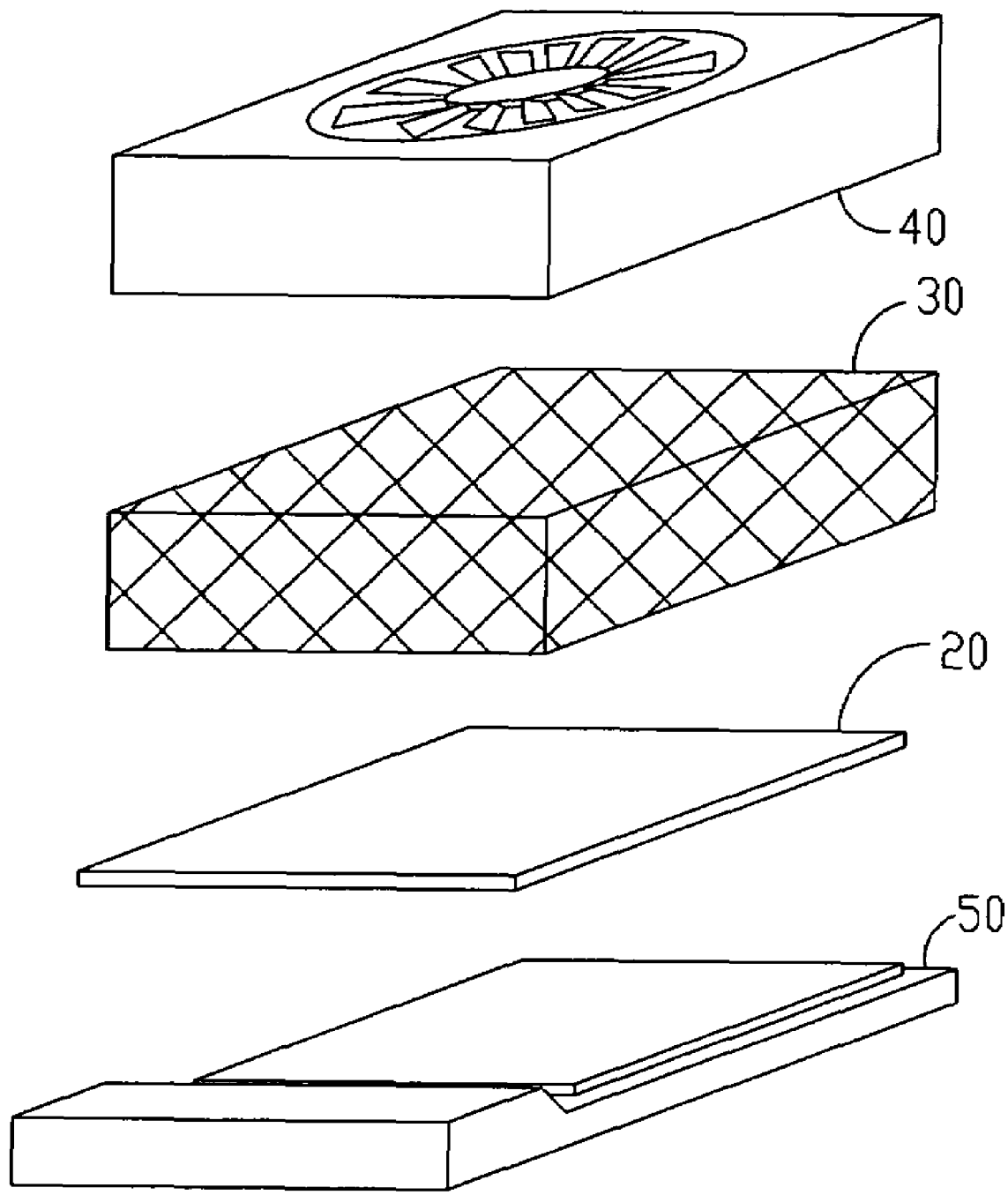
FIG. 3B is a schematic diagram of embodiment according to another preferred embodiment of the present invention.

FIG. 3A and FIG. 3B are structural schematic diagrams according to another preferred embodiment of the present invention. As shown in the figure, the heat sink member 30 according to the present invention can be a 3D fabric. At appropriate positions of the heat sink member 30, a plurality of mounting posts 36 are adapted for installing a fan 40 or a heat sink member 30. The mounting posts 36 can be made of heat-sinking materials. Tin solder balls 38 can further be adapted on one end of the mounting posts 36 for mounting the heat sink member 30. On the other hand, the mounting posts 36 can also be mounted on the electronic apparatus without the tin solder balls 38. For example, the mounting posts 36 can be adapted in the corresponding mounting holes of the heat-generating member 10 for supporting the fan 40. When the present invention is applied to a CPU 50, the CPU 50 is the heat-generating member 10, and the heat sink member 30 is adapted on the CPU 50. In order to make the heat generated by the CPU 50 be conducted more easily to the heat sink member 30, the substrate 20 can be adapted by the heat sink member 30, and the fan 40 can be adapted on the heat sink member 30. The fan 40 can remove rapidly the heat conducted from the heat-generating member 10 to the heat sink member 30, thus enhancing the heat-sinking efficiency.

Figure 4A:
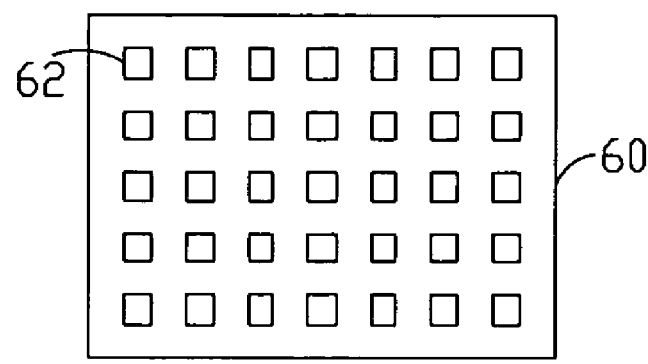
FIG. 4A is a structural schematic diagram of a heat sink member according to another preferred embodiment of the present invention.
Figure 4B:
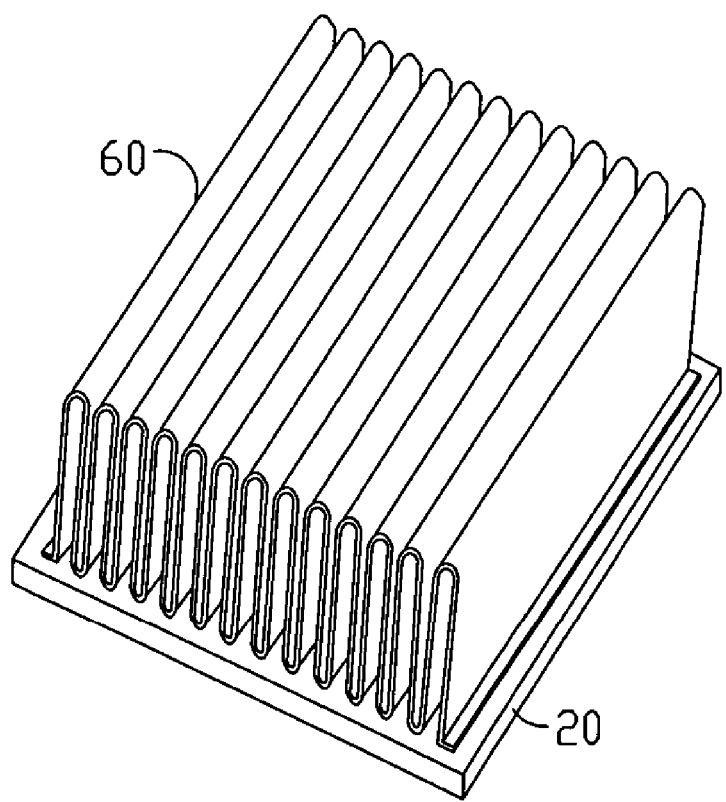
FIG. 4B is a schematic diagram of embodiment according to another preferred embodiment of the present invention.

FIG. 4A and FIG. 4B are structural schematic diagrams according to another preferred embodiment of the present invention. According to the present invention, the heat sink member includes an expanded metal-lath member 60. The manufacturing method of the expanded metal-lath member 60 is the prior art, wherein metal flakes are compressed and elongated and a plurality of meshes 62 are formed on surfaces of the metal flakes in terms of molds. According to the design of the molds, the shapes of the meshes 62 vary, for example, as a circle, a rhombus, or a square, etc. In addition, the thickness of the metal flakes varies according to the heat-sinking demands of the different heat-generating members. The expanded metal-lath member 60 is planar, which is significantly different from the meshed member. Because the meshed member is woven by crossed wires, overlap areas will occur on wire intersections and thus the meshed member is non-planar. Thereby, at contact points, only wires of one of the two weaving directions will make contact. On the other hand, the expanded metal-lath member 60 is manufactured by compressing and elongating metal flakes, thereby the disadvantage described above will not occur. The expanded metal-lath member 60 can be mounted on the substrate 20 as shown in FIG. 4B.

To sum up, the present invention discloses that, by using a meshed member as the heat sink member, the heat-sinking efficiency will be enhanced owing to increased surface areas. Furthermore, the first linear member is made to contact with the substrate at non-perpendicular angles to increase the stresses thereof, and hence the heat sink member is more resistive to deformation during processing. In addition, the meshed member also provides multiple heat flow paths to enhance heat-sinking efficiency. The heat sink member according to the present invention can also be a 3D fabric, which further improves heat-sinking efficiency from 2D to 3D fabrics. Besides, the heat sink member includes an expanded metal-lath member, which improves the disadvantage of single contact of the meshed member with the substrate due to the overlaps resulting from wire intersections thereof.

The foregoing description is only a preferred embodiment of the present invention, not used to limit the scope and range of the present invention. Those equivalent changes or modifications made according to the shape, structure, feature, or spirit described in the claims of the present invention are included in the appended claims of the present invention.

The invention claimed is:

1. A heat sink apparatus, comprising:
   a heat-generating member;
   a substrate, adapted on the heat-generating member; and
   a heat sink member, adapted on the substrate, and comprising:
      a plurality of first longitudinally extended members, at least a portion of the plurality of first longitudinally extended members contacting the substrate at a non-perpendicular angle;
      a plurality of second longitudinally extended members, the plurality of second longitudinally extended members intersecting with at least a portion of the first longitudinally extended members, and the angle between the plurality of second longitudinally extended members and the substrate being non-perpendicular;
      wherein each second longitudinally extended member crosses alternatingly over and under respective ones of the plurality of first longitudinally extended members to form a woven structure of the heat sink member;
      wherein each first longitudinally extended member extends in a first direction and each second longitudinally extended member extends in a second direction, the first direction being different than the second direction.

2. The heat sink apparatus in claim 1, wherein the heat-generating member is a central processing unit or a chipset.

3. The heat sink apparatus in claim 1, wherein the material of the substrate is chosen from the group consisting of metals and materials with high thermal conductivity coefficients.

4. The heat sink apparatus in claim 1, wherein the woven structure of the heat sink member defines a woven mesh.

5. The heat sink apparatus in claim 1, wherein the material of the heat sink member is chosen from the group consisting of metals and materials with high thermal conductivity coefficients.

6. The heat sink apparatus in claim 1, and further comprising a fan adapted on one side or above the heat sink member to sink heat from the heat sink member.

7. The heat sink apparatus in claim 1, and further comprising a fan adapted on one side or above the three-dimensional woven heat sink member to sink heat from the three-dimensional woven heat sink member.

8. A heat sink apparatus, comprising:

a heat-generating member;

a substrate, adapted on the heat-generating member;

an expanded metal-lath member having a plurality of apertures to define a mesh and adapted on the substrate, the expanded metal lath member being formed in an undulating contour, the undulations extending longitudinally across a surface portion of the substrate.

9. The heat sink apparatus in claim 8, wherein the heat-generating member is a central processing unit or a chipset.

10. The heat sink apparatus in claim 8, wherein the material of the substrate is chosen from the group consisting of metals and materials with high thermal conductivity coefficients.

11. The heat sink apparatus in claim 8, wherein the material of the expanded metal-lath member is chosen from the group consisting of metals and materials with high thermal conductivity coefficients.

12. The heat sink apparatus in claim 8, and further comprising a fan adapted on one side or above the expanded metal-lath member to sink heat from the heat sink member.

13. The heat sink apparatus in claim 8, wherein apertures of the expanded metal-lath member have a contour selected from any one of various shapes.

* * * * *